(12) United States Patent
Gamo

(10) Patent No.: US 6,373,168 B1
(45) Date of Patent: Apr. 16, 2002

(54) BALANCED INPUT-OUTPUT PIEZOELECTRIC FILTER

(75) Inventor: Masao Gamo, Takaoka (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/627,768

(22) Filed: Jul. 28, 2000

(30) Foreign Application Priority Data

Jul. 29, 1999 (JP) .......................................... 11-214727

(51) Int. Cl.⁷ ...................... H03H 9/13; H01L 41/047
(52) U.S. Cl. ...................... 310/320; 310/359; 310/366; 333/186
(58) Field of Search ................................ 310/320, 359, 310/366; 333/186, 187

(56) References Cited

U.S. PATENT DOCUMENTS

| | | | | |
|---|---|---|---|---|
| 4,939,403 A | * | 7/1990 | Kittaka et al. | 310/320 |
| 5,057,801 A | * | 10/1991 | Kittaka et al. | 310/320 |
| 5,294,860 A | * | 3/1994 | Gamo | 310/320 |
| 5,635,786 A | * | 6/1997 | Fujimoto et al. | 310/316.01 |

* cited by examiner

*Primary Examiner*—Thomas M. Dougherty
(74) *Attorney, Agent, or Firm*—Keating & Bennett, LLP

(57) ABSTRACT

A balanced input-output piezoelectric filter includes a piezoelectric ceramic substrate provided therein with a ground electrode. Input electrodes and output electrodes are located on both major surfaces of the piezoelectric ceramic substrate so as to be adjacent to each other. The input electrodes function as a balanced-circuit connecting electrode and are connected to balanced input terminals. The output electrodes function as a balanced-circuit connecting electrode and are connected to balanced output terminals.

14 Claims, 4 Drawing Sheets

BALANCED INPUT-OUTPUT PIEZOELECTRIC FILTER

BACKGROUND OF THE INVENTION

1. Field of the Invention

The present invention relates to piezoelectric filters, and more particularly relates to balanced input-output piezoelectric filters with improved voltage utilization efficiency and noise resistance.

2. Description of the Related Art

In general, conventional balanced input-output piezoelectric filters using a surface acoustic wave (SAW) provided in a video IF amplifying circuit in a television receiver or other such apparatuses are well known. However, filters utilizing a bulk wave of a piezoelectric substrate, such as a 4.5 MHz-piezoelectric filter provided in an audio IF amplifying circuit in the television receiver and a 10.7-MHz piezoelectric filter provided in an IF amplifying circuit in an FM receiver, are not designed for balanced input and output.

Specifically, conventional piezoelectric filters are unbalanced input-output piezoelectric filters to and from which an unbalanced signal is input and output. Thus, the conventional piezoelectric filters have low voltage utilization efficiency and are influenced by common mode noise having the same phase with respect to a ground.

SUMMARY OF THE INVENTION

To overcome the problems described above, preferred embodiments of the present invention provide a balanced input-output piezoelectric filter with greatly improved voltage utilization efficiency and noise resistance.

According to one preferred embodiment of the present invention, a balanced input-output piezoelectric filter includes a ground electrode provided at the approximate center of a piezoelectric substrate in the thickness direction and at least one of an input electrode and an output electrode provided on both major surfaces of the piezoelectric substrate so as to be opposed to the ground electrode, thus providing a balanced-circuit connecting electrode. The piezoelectric substrate is vibrated in a thickness expansion vibration mode.

At least one of the input electrode and the output electrode provided on both major surfaces of the piezoelectric substrate functions as a balanced-circuit connecting input electrode or a balanced-circuit connecting output electrode. When the piezoelectric substrate is polarized in two opposite directions with the ground electrode provided therebetween as a boundary, the piezoelectric substrate expands and contracts in the thickness direction such that one side from the ground electrode expands while the other side contracts. Hence, the piezoelectric substrate vibrates in a double-wave mode. When the piezoelectric substrate is polarized in the same direction with the ground electrode provided as the boundary, both sides of the piezoelectric substrate expand and contract together. Hence, the piezoelectric substrate vibrates in a fundamental-wave mode.

According to a preferred embodiment of the present invention, the ground electrode is provided in the piezoelectric substrate, and at least one of the input electrode and the output electrode is provided on both principal planes of the piezoelectric substrate. Therefore, the piezoelectric filter for balanced input and output is obtained. As a result, a balanced input-output piezoelectric filter having improved voltage utilization efficiency and noise resistance against common mode noise is obtained even when the filter uses a bulk wave of the piezoelectric substrate.

Other features, characteristics, elements and advantages of the present invention will become apparent from the following description of preferred embodiments thereof with reference to the attached drawings.

DETAILED DESCRIPTION OF PREFERRED EMBODIMENTS

Preferred embodiments of the present invention are described with reference to the accompanying drawings.

Figure 1:
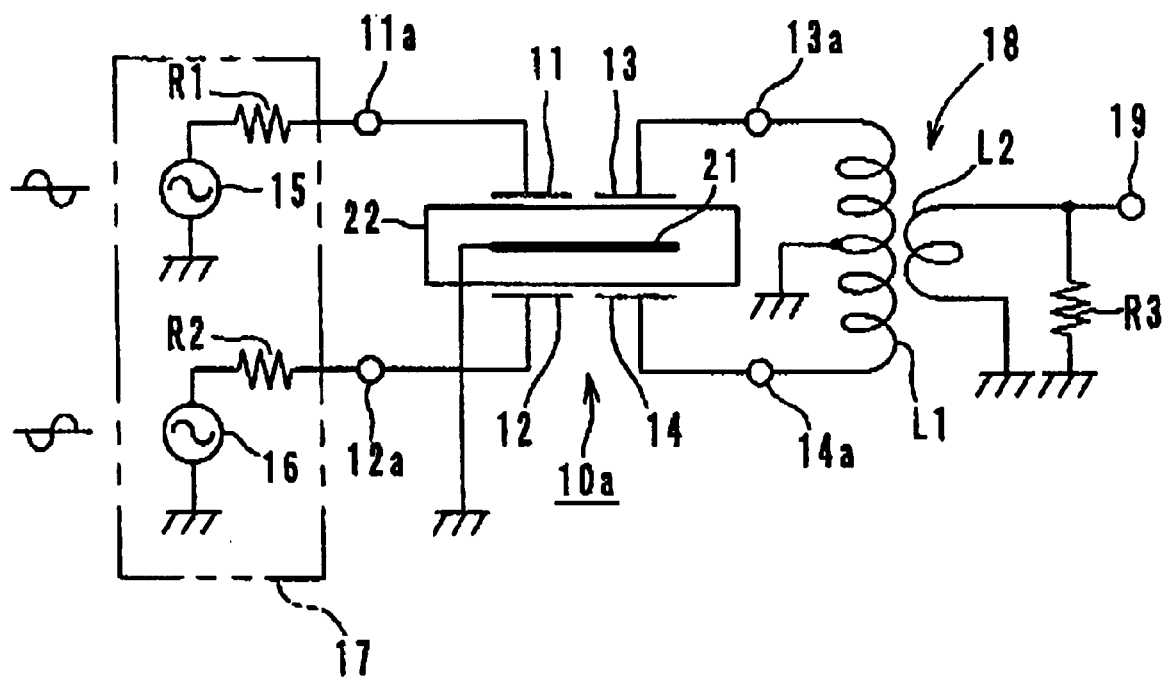
FIG. 1 is a circuit diagram of a balanced input-output piezoelectric filter according to a first preferred embodiment of the present invention.
Figure 2:
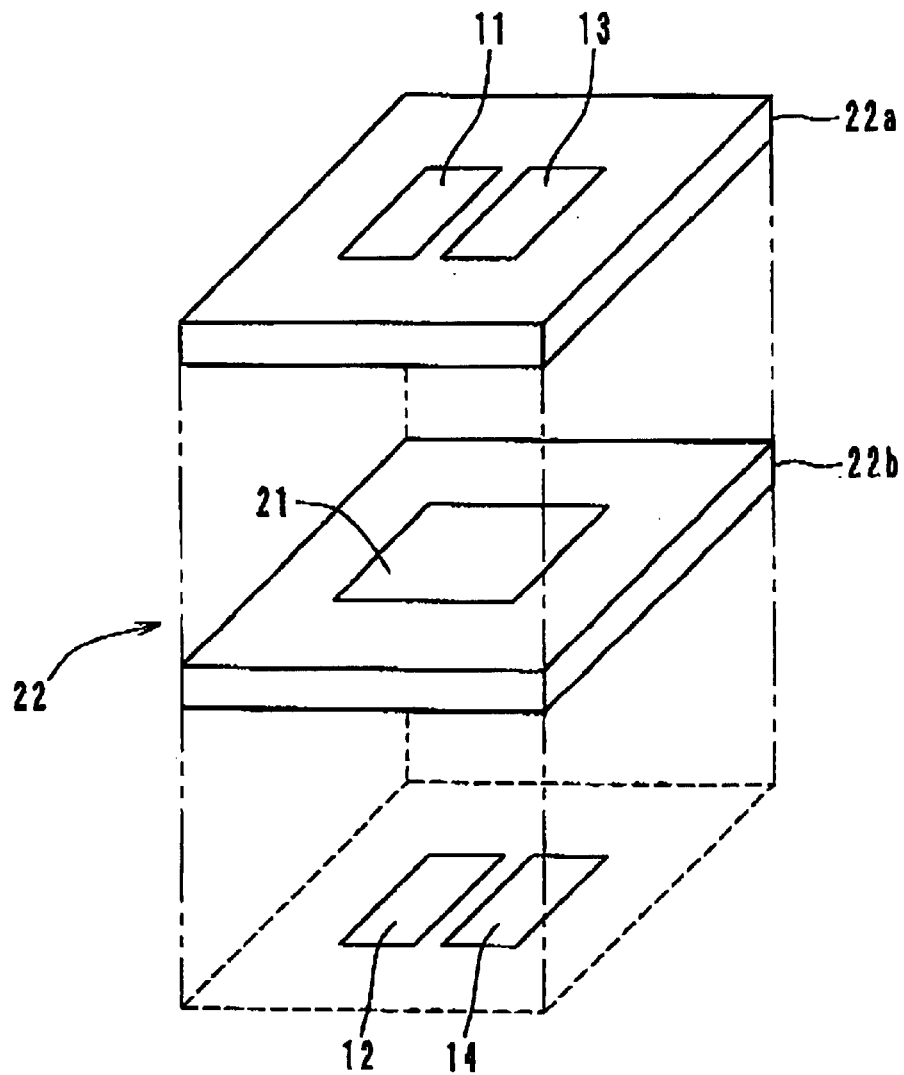
FIG. 2 is an exploded perspective view of a piezoelectric ceramic substrate and an electrode structure of the balanced input-output piezoelectric filter shown in FIG. 1.

FIG. 1 shows a balanced input-output piezoelectric filter according to a first preferred embodiment of the present invention. A balanced input-output piezoelectric filter 10a is designed for balanced input and balanced output and includes a piezoelectric ceramic substrate 22 provided therein with a ground electrode 21. Referring to FIG. 2, the ceramic substrate 22 includes at least two ceramic sheets 22a and 22b, which are stacked and baked to form the ceramic substrate 22. An input electrode 11 and an output electrode 13 are provided on a top surface of the ceramic sheet 22a so as to be adjacent to each other. The ground electrode 21 is provided on a top surface of the ceramic sheet 22b. An input electrode 12 and an output electrode 14 are provided on a bottom surface of the ceramic sheet 22b so as to be adjacent to each other.

Figure 3:
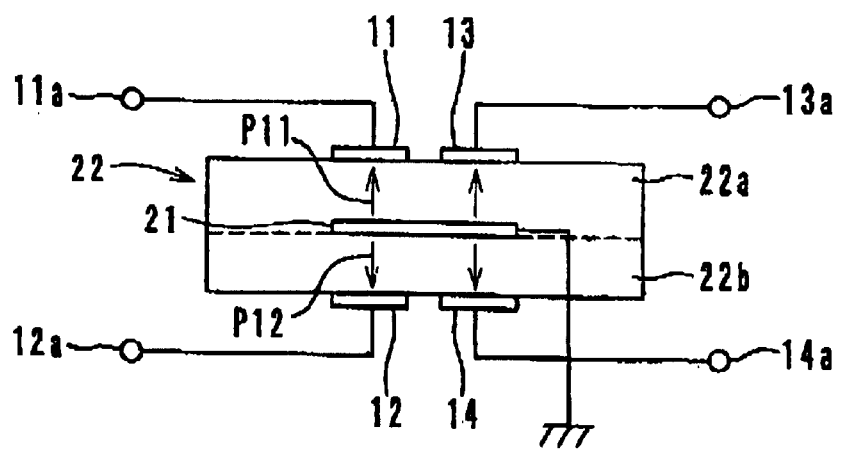
FIG. 3 is an illustration of polarization of the piezoelectric ceramic substrate of the balanced input-output piezoelectric filter shown in FIG. 1.

The input electrode 11 and the output electrode 13 are opposed to the ground electrode 21 with the ceramic sheet 22a therebetween. The input electrode 12 and the output electrode 14 are opposed to the ground electrode 21 with the ceramic sheet 22b therebetween. Referring now to FIG. 3, the piezoelectric ceramic substrate 22 is polarized such that the ceramic sheet 22a is polarized in a direction indicated by arrows P11 extending from the ground electrode 21 toward the input electrode 11 and the output electrode 13. The ceramic sheet 22b is polarized in a direction indicated by arrows P12 extending from the ground electrode 21 toward the input electrode 12 and the output electrode 14.

The pair of input electrodes 11 and 12 functions as a balanced-circuit connecting electrode. The input electrodes 11 and 12 are connected to balanced input terminals 11a and 12a, respectively. The output electrodes 13 and 14 function as a balanced-circuit connecting electrode. The output electrodes 13 and 14 are connected to balanced output terminals 13a and 14a, respectively. A balanced signal is input to the balanced input terminals 11a and 12a from a balanced-signal source 17 including two ideal voltage sources 15 and 16 and output resistors R1 and R2 connected to the ideal voltage sources 15 and 16, respectively. A primary winding L1 of a transformer 18 for transforming a balanced output of the balanced input-output piezoelectric filter 10a into an unbalanced output is connected between the balanced output terminals 13a and 14a. A center tap of the primary winding L1 of the transformer 18 is connected to a ground. One end of a secondary winding L2 is connected to an unbalanced output terminal 19, whereas the other end of the secondary winding L2 is grounded. A matching resistor R3 is connected between the unbalanced output terminal 19 and the ground.

Figure 4:
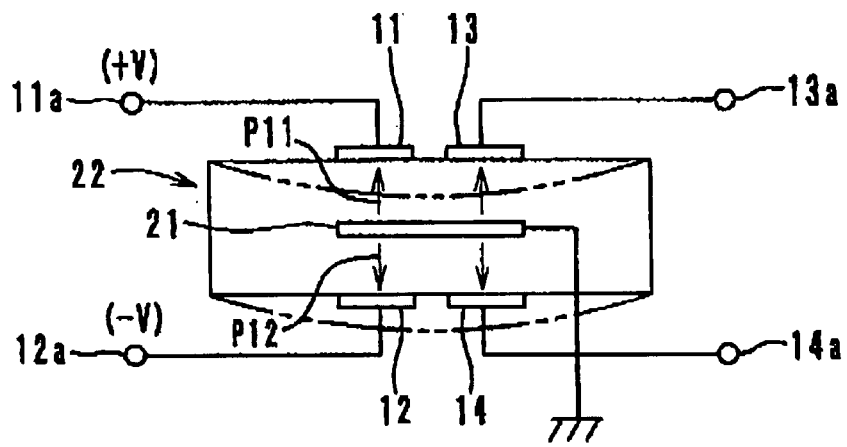
FIG. 4 is an illustration of a double-wave mode vibration of the piezoelectric ceramic substrate of the balanced input-output piezoelectric filter shown in FIG. 1.

In the balanced input-output piezoelectric filter 10a as described above, as shown in FIG. 3, the piezoelectric ceramic substrate 22 is polarized in two opposite directions with the ground electrode 21 provided therebetween as a boundary. When voltages +V and −V are applied to the balanced input terminals 11a and 12a, respectively, one of the ceramic sheet 22a and the ceramic sheet 22b of the piezoelectric ceramic substrate 22 expands in the thickness direction while the other contracts. Hence, the piezoelectric ceramic substrate 22 is deformed as indicated by two-dot chain lines shown in FIG. 4 and vibrates in a second harmonic wave mode. This vibration generates a voltage in the piezoelectric ceramic substrate 22. The generated voltage is drawn out from the output electrodes 13 and 14 and output from the balanced output terminals 13a and 14a. Since the piezoelectric filter 10a of this preferred embodiment includes a balanced input and output structure, a balanced input-output piezoelectric filter with excellent voltage utilization efficiency and noise resistance against common mode noise is obtained even when the filter utilizes a bulk wave of the piezoelectric ceramic substrate 22.

Figure 5:
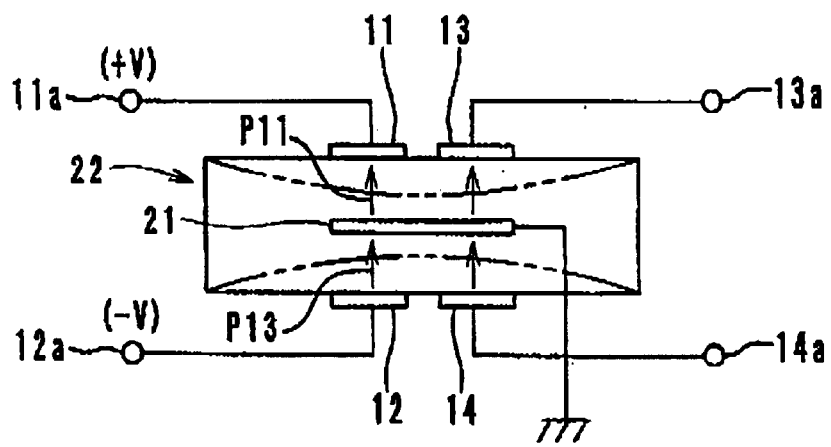
FIG. 5 is an illustration of a fundamental-wave mode vibration of the piezoelectric ceramic substrate of the balanced input-output piezoelectric filter shown in FIG. 1.

Alternatively, in the first preferred embodiment of the present invention, the polarization direction of the ceramic sheet 22b of the piezoelectric ceramic substrate 22 can be reversed as indicated by arrows P13 shown in FIG. 5. This is in the opposite direction to the direction indicated by the arrows P12 shown in FIG. 3. With this polarization, the ceramic sheets 22a and 22b of the piezoelectric ceramic substrate 22 expand and contract together in the thickness direction. Hence, the piezoelectric ceramic substrate 22 is deformed as indicated by two-dot chain lines in FIG. 5 and vibrates in a fundamental-wave mode.

Figure 6:
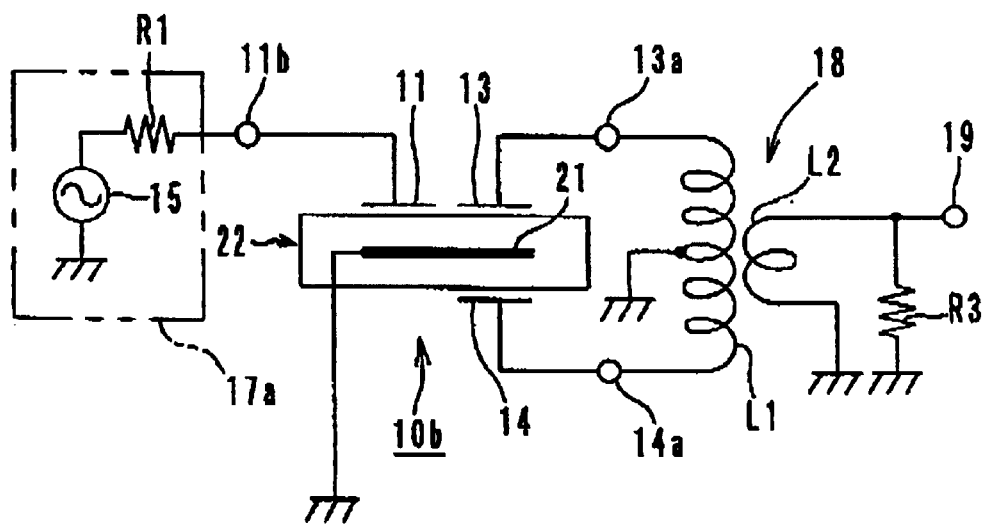
FIG. 6 is a circuit diagram of a balanced input-output piezoelectric filter according to a second preferred embodiment of the present invention.

Referring now to FIG. 6, a balanced input-output piezoelectric filter according to a second preferred embodiment of the present invention is described. A balanced input-output piezoelectric filter 10b is designed for unbalanced input and balanced output. The balanced input-output piezoelectric filter 10b is different from the balanced input-output piezoelectric filter 10a in that it does not have the input electrode 12 of the balanced input-output piezoelectric filter 10a. The input electrode 11 provided on the piezoelectric substrate 22 functions as an unbalanced-circuit connecting electrode and is connected to an unbalanced input terminal 11b. An unbalanced signal is input to the unbalanced input terminal 11b from an unbalanced-signal source 17a including the ideal voltage source 15 and the output resistor R1.

Since the balanced input-output piezoelectric filter 10b includes the balanced output structure, output of common mode noise from the output end is substantially suppressed. In FIG. 6, the same reference numerals are given to the components corresponding to those in FIG. 1, and a repeated description of the common portions is omitted.

Figure 7:
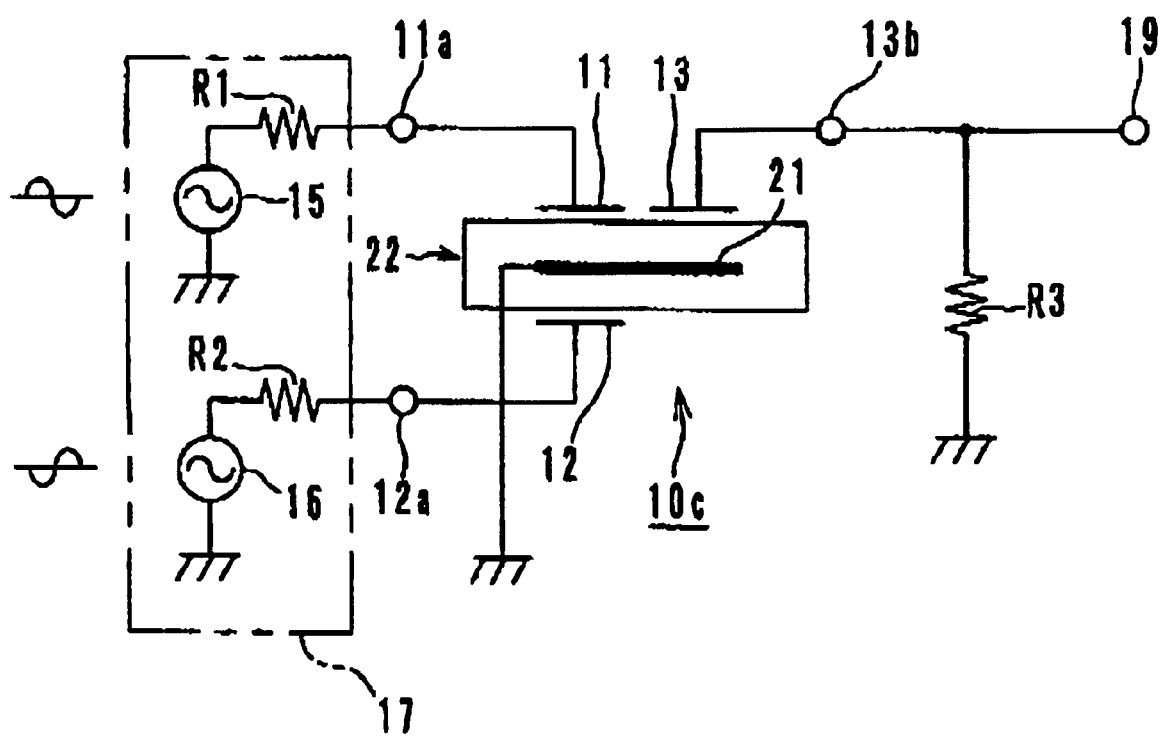
FIG. 7 is a circuit diagram of a balanced input-output piezoelectric filter according to a third preferred embodiment of the present invention.

Referring to FIG. 7, a balanced input-output piezoelectric filter according to a third preferred embodiment of the present invention is described below. A balanced input-output piezoelectric filter 10c is designed for balanced input and unbalanced output. The balanced input-output piezoelectric filter 10c is different from the balanced input-output piezoelectric filter 10a shown in FIG. 1 in that it does not have the output electrode 14 and the output transformer 18 of the balanced input-output piezoelectric filter 10a. The output electrode 13 provided on the piezoelectric substrate 22 functions as an unbalanced-circuit connecting electrode and is connected to an unbalanced output terminal 13b. The matching resistor R3 is connected between the unbalanced output terminal 13b and the ground.

Since the balanced input-output piezoelectric filter 10c includes the balanced input structure, common mode noise from the input side is substantially suppressed. In FIG. 7, the same reference numerals are given to the components corresponding to those in FIG. 1, and a repeated description thereof is omitted.

It should be understood that the foregoing description is only illustrative of the present invention. Various alternatives and modifications can be devised by those skilled in the art without departing from the invention. Accordingly, the present invention is intended to embrace all such alternatives, modifications and variations that fall within the scope of the appended claims.

What is claimed is:

1. A balanced input-output piezoelectric filter comprising:
   a piezoelectric substrate including two major surfaces;
   a ground electrode provided in the piezoelectric substrate; and
   at least one input electrode and at least one output electrode provided respectively on the two major surfaces of the piezoelectric substrate so as to be opposed to the ground electrode with the piezoelectric substrate therebetween, thus defining a balanced-circuit connecting electrode;
   wherein the piezoelectric substrate vibrates in a fundamental-wave thickness expansion vibration mode.

2. A balanced input-output piezoelectric filter according to claim 1, wherein at least one of said input electrode and said output electrode includes one input electrode and one output electrode provided on both major surfaces of said piezoelectric substrate.

3. A balanced input-output piezoelectric filter according to claim 1, wherein at least one of said input electrode and said output electrode includes one input electrode and one output electrode on one of said major surfaces of said piezoelectric substrate, and an input electrode on the other of said major surfaces of said piezoelectric substrate.

4. A balanced input-output piezoelectric filter according to claim 1, wherein at least one of said input electrode and said output electrode includes one input electrode and one output electrode on one of said major surfaces of said piezoelectric substrate, and an output electrode on the other of said major surfaces of said piezoelectric substrate.

5. A balanced input-output piezoelectric filter according to claim 1, wherein said piezoelectric substrate includes a first ceramic sheet and a second ceramic sheet.

6. A balanced input-output piezoelectric filter according to claim 1, wherein said piezoelectric substrate is polarized in a common direction with the ground electrode therebetween defining a boundary, such that said piezoelectric substrate vibrates in the fundamental-wave mode.

7. A balanced input-output piezoelectric filter according to claim 5, wherein at least one of an input electrode and an output electrode is provided on a top surface of said first ceramic sheet and to a bottom surface of said second ceramic sheet.

8. A balanced input-output piezoelectric filter according to claim 5, wherein said ground electrode is provided on a top surface of said second ceramic sheet.

9. A balanced input-output piezoelectric filter according to claim 1, wherein the ground electrode is located substantially at the center of the piezoelectric substrate in the thickness direction thereof.

10. A balanced input-output piezoelectric filter according to claim 5, wherein at least one of said input electrode and said output electrode includes an input electrode and an output electrode provided on one of a top surface of said first ceramic sheet and a bottom surface of said second ceramic sheet, and an output electrode provided on the other of said top surface of said first ceramic sheet and said bottom surface of said second ceramic sheet, said ground electrode is provided on a top surface of said second ceramic sheet such that said input electrodes and said output electrodes are opposed to said ground electrode with said first and second ceramic sheet therebetween.

11. A balanced input-output piezoelectric filter according to claim 7, wherein said first and second ceramic sheets are polarized in the same direction, such that said piezoelectric substrate vibrates in the fundamental-wave mode.

12. A balanced input-output piezoelectric filter according to claim 5, wherein at least one of said input electrode and said output electrode includes at least one of an input electrode and an output electrode provided on both a top surface of said first ceramic sheet and a bottom surface of said second ceramic sheet, said ground electrode is provided on a top surface of said second ceramic sheet such that said input electrodes and said output electrodes are opposed to said ground electrode with said first and second ceramic sheet disposed therebetween.

13. A balanced input-output piezoelectric filter according to claim 5, wherein at least one of said input electrode and said output electrode includes an input electrode and an output electrode provided on both a top surface of said first ceramic sheet and a bottom surface of said second ceramic sheet, said ground electrode is provided on a top surface of said second ceramic sheet such that said input electrodes and said output electrodes are opposed to said ground electrode with said first and second ceramic sheet disposed therebetween.

14. A balanced input-output piezoelectric filter according to claim 5, wherein at least one of said input electrode and said output electrode includes an input electrode and an output electrode provided on one of a top surface of said first ceramic sheet and a bottom surface of said second ceramic sheet, and an input electrode provided on the other of said top surface of said first ceramic sheet and said bottom surface of said second ceramic sheet, said ground electrode is provided on a top surface of said second ceramic sheet such that said input electrodes and said output electrodes are opposed to said ground electrode with said first and second ceramic sheet therebetween.

* * * * *